US012601775B2

(12) United States Patent
Deng et al.

(10) Patent No.: US 12,601,775 B2
(45) Date of Patent: Apr. 14, 2026

(54) METHOD AND SYSTEM FOR TESTING CONVERSION LOSSES OF TERAHERTZ MIXERS CAPABLE OF ELIMINATING INFLUENCE OF RADIO FREQUENCY SOURCES

(71) Applicant: CEYEAR TECHNOLOGIES CO., LTD., Shandong (CN)

(72) Inventors: Jianqin Deng, Qingdao (CN); Mo Wang, Qingdao (CN); Xiang Zhu, Qingdao (CN); Fushun Nian, Qingdao (CN); Wanshun Jiang, Qingdao (CN); Shengzhou Zhang, Qingdao (CN)

(73) Assignee: CEYEAR TECHNOLOGIES CO., LTD., Qingdao (CN)

( * ) Notice: Subject to any disclaimer, the term of this patent is extended or adjusted under 35 U.S.C. 154(b) by 421 days.

(21) Appl. No.: 18/022,422

(22) PCT Filed: Nov. 6, 2020

(86) PCT No.: PCT/CN2020/127190
§ 371 (c)(1),
(2) Date: Feb. 21, 2023

(87) PCT Pub. No.: WO2022/036873
PCT Pub. Date: Feb. 24, 2022

(65) Prior Publication Data
US 2023/0324448 A1 Oct. 12, 2023

(30) Foreign Application Priority Data
Aug. 18, 2020 (CN) .......................... 202010832968.6

(51) Int. Cl.
*G01R 31/00* (2006.01)

(52) U.S. Cl.
CPC ................................. *G01R 31/001* (2013.01)

(58) Field of Classification Search
CPC .... G01R 31/001; G01R 27/28; G01R 23/163; Y02D 30/70
See application file for complete search history.

(56) References Cited

U.S. PATENT DOCUMENTS 4,045,730 A 8/1977 Singer et al.

FOREIGN PATENT DOCUMENTS

CN 104217075 A 12/2014
CN 105067894 A 11/2015
(Continued)

OTHER PUBLICATIONS

Katsumi Fujii et al, RF Power Measurement in D-band Using Down-converter Calibrated by Three-mixer Method, IEICE Electronics express, (2012) vol. 9, No. 12, p. 1096-1101, item 3 on NPL documents list, cited on the IDS Feb. 21, 2023.*
(Continued)

*Primary Examiner* — Eman A Alkafawi
*Assistant Examiner* — Suresh K Rajaputra
(74) *Attorney, Agent, or Firm* — Oliff PLC

(57) ABSTRACT

A method and system for testing the conversion losses of terahertz mixers capable of eliminating the influence of radio frequency sources includes grouping a mixer to be tested and at least two reference mixers in pairs; in each group, inputting a signal of a preset frequency and a preset power at an intermediate frequency port of a first mixer, and after up-conversion, outputting same to a second mixer to be down-converted, so as to obtain an output power with the frequency same as the preset frequency, and obtain the relationship between a first output power and a first preset power and the losses of two mixers; according to the relationship between the loss of the mixer in each group and the power, obtaining the loss of the mixer to be tested.

8 Claims, 3 Drawing Sheets

(56) References Cited

FOREIGN PATENT DOCUMENTS

| CN | 105991092 A | 10/2016 |
|----|-------------|---------|
| CN | 106533365 A | 3/2017  |
| CN | 107271938 A | 10/2017 |
| CN | 111880013 A | 11/2020 |

OTHER PUBLICATIONS

May 19, 2021 International Search Report issued in International Patent Application No. PCT/CN2020/127190.

May 19, 2021 Written Opinion issued in International Patent Application No. PCT/CN2020/127190.

Katsumi Fujii et al. "RF Power Measurement in D-Band Using Down-Converter Calibrated by Three-Mixer Method". IEICE Electronics Express, vol. 9, No. 13, Jul. 5, 2012, pp. 1096-1101.

Mar. 10, 2021 Office Action issued in Chinese Patent Application No. 202010832968.6.

Toshihide Tosaka et al. "Measurement of Frequency Conversion Losses With 3-Mixer Method for Traceable MM-Wave Power Measurement Method in D-Band". 2012 37th International Conference on Infrared, Millimeter, and Terahertz Waves, pp. 1-2.

Lianzhao Liu et al. "Research on Measuring and Compensating for Frequency Conversion Loss on Mixer". China Measurement & Test, vol. 44, No. 12, Dec. 2018, pp. 107-110 and 128.

Yichi Zhang et al. "Removing Random Phase Contributions Sweeping Local Oscillator From Modulated RF Measurement". IEEE Transactions on Microwave Theory and Techniques, vol. 66, No. 12, pp. 5737-5749.

Song Xiang et al. "Measurement of Mixer Based on Vector Network Analyzer". Electronic Measurement Technology, vol. 34, No. 11, 2011, pp. 113-117.

* cited by examiner

METHOD AND SYSTEM FOR TESTING CONVERSION LOSSES OF TERAHERTZ MIXERS CAPABLE OF ELIMINATING INFLUENCE OF RADIO FREQUENCY SOURCES

TECHNICAL FIELD

The present disclosure relates to the technical field of testing the conversion losses of terahertz mixers, in particular to a method and system for testing the conversion losses of terahertz mixers capable of eliminating the influence of radio frequency sources.

BACKGROUND

The description in this section merely provides background information related to the present disclosure, and does not necessarily constitute the prior art.

A terahertz (THz) wave mainly refers to an electromagnetic wave whose operating frequency is between 0.1 THz and 10 THz (wavelength extending from 30 μm to 3 mm). The frequency band thereof coincides with the electromagnetic gap between microwaves and infrared, referred to as the "THz Gap", and is a wave band which is the least understood and developed by human to date. Because the terahertz wave is located between the microwave and the infrared, it combines many of the advantages of both, and also exhibits many unique characteristics, such as high bandwidth, strong penetration, rich information carried, low photon energy, high spatial and temporal coherence and high security. These characteristics also make it in the fields of national defense, homeland security, astronomy, medical treatment, life sciences, communications, etc., have high scientific value and great application value. A terahertz mixer is a core component in the receiving front end of a terahertz test instrument. Its main function is to convert a terahertz signal with a relatively high frequency into a low-frequency microwave signal, finishing receiving the terahertz signal, which has a wide range of applications in terahertz radars, security check imaging, meteorological remote sensing, test instruments, etc. Numerous science researchers have carried out numerous technical studies on the terahertz mixer and have also achieved fruitful results. Testing the conversion loss of the terahertz mixer is one of the important technical indicators for the performance characterization of the mixer, and how to test it accurately has become one of the important bottleneck technologies in the development process of the terahertz mixer.

The inventors of the present disclosure have found that at present, there are two main technical approaches to the commonly used solution for testing the terahertz mixer, as shown in FIG. 1 and FIG. 2, respectively.

FIG. 1 is an extension of the solution for testing the conversion losses of microwave and millimeter wave mixers to the terahertz band. This technical solution makes use of the frequency characteristics of the mixer; by adding a terahertz radio frequency source (power PRO at a radio frequency port and performing mixing with a local oscillation source of a local oscillation port of the mixer, a low-frequency intermediate frequency signal is generated; then the conversion loss (CL) of the terahertz mixer can be tested by testing the intermediate frequency signal (power $P_{IF}$) through a spectrometer.

The main principle of operation thereof is that a microwave signal source 105 provides signals of microwave and millimeter wave bands. Signals of a terahertz band are generated by a frequency doubling amplification cascade link (the signal can also be generated using other technical routes). The terahertz signal passes through a test channel standing wave matching unit 150, usually a directional coupler or an isolator, etc., and the resulting terahertz signal is fed to the radio frequency end of a terahertz mixer 135. The power of the terahertz signal fed at this moment can be calibrated by a terahertz power meter and noted as $P_{RF}$, and down-mixing with a local oscillation signal (what is as shown in FIG. 1 is the local oscillation signal generated by local oscillation frequency doubling excitation, and other signal generation methods can also be used) fed to the local oscillation port of the terahertz mixer 135 is performed. The down-mixed intermediate frequency signal is tested by a spectrum analyzer or a power meter, and the measured frequency of the down-converted intermediate frequency signal is marked as $P_{IF}$. The conversion loss of the terahertz mixer is noted as CL, $CL=P_{RF}-P_{IF}$.

From the above description, it is easy to see that the test solution requires a radio frequency source and the power of the radio frequency source can be accurately calibrated, whereas there is currently no terahertz power standard for accurate calibration of power. As a result, uncertainty of the source will be introduced into the test value of the conversion loss of the terahertz mixer. Secondly, for testing the conversion loss of a broadband terahertz mixer, the influence of the terahertz source becomes more serious, which is mainly because the poor in-band stray suppression of a broadband terahertz source. The uncertainty of the source not only includes the uncertainty of a power test, but also introduces the uncertainty caused by the deterioration of the signal quality. In addition, mixer testing cannot be carried out if a terahertz source is missing, which requires higher development conditions on the development of the mixer. In summary, the traditional test for the conversion loss of the terahertz mixer is affected by the elevated frequency band, which has high demands on the terahertz source. The conversion loss of the mixer cannot be accurately tested, and the demand on the development platform is also high, which has a profound impact on the development and application of the terahertz mixer (especially the broadband terahertz mixer).

The test method shown in FIG. 2 is based on the Y-factor, and the method is an open-space test method. The specific principle of operation is as follows: a load 210 is at a room temperature (usually 296 K) and a low temperature (usually 80 K), respectively; the radiated thermal noise, through an antenna 230, is received and fed back to the radio frequency port of a terahertz mixer 215, to be mixed with a local oscillation signal generated by a local oscillation frequency doubling amplification link 220 (or other signal generation methods can be used); after a mixed intermediate frequency signal passes through an attenuating, amplifying and filtering link 225, the intermediate frequency powers in the two states are tested through a power meter 205 and are respectively $P_{hot}$ and $P_{cold}$.

The expression for the Y factor is:

$$Y = \frac{P_{hot}}{P_{cold}} \tag{1}$$

the equivalent noise temperature of a receiver is:

$$T_{sys} = \frac{T_{hot} - Y \times T_{cold}}{Y - 1} \tag{2}$$

the expression for the equivalent noise temperature of a receiver is:

$$T_{sys} = T_{Mix} + \frac{T_{IF\_link}}{G_{Mix}} \qquad (3)$$

the conversion loss of the mixer is:

$$CL = -10 \log_{10}(G_{Mix}) \qquad (4)$$

it can be seen from the expression (3) that there are two unknown quantities of the noise temperature $T_{Mix}$ of the mixer and the conversion gain GM two equations (5) and (6) are constructed through different states of two intermediate frequency links, and $T_{Mix}$ and $G_{Mix}$ can be solved by solving (5) and (6) so as to obtain the conversion loss (CL) of the mixer;

$$T_{sys\_1} = T_{Mix} + \frac{T_{IF\_link1}}{G_{Mix}} \qquad (5)$$

$$T_{sys\_2} = T_{Mix} + \frac{T_{IF\_link2}}{G_{Mix}} \qquad (6)$$

by solving the two equations (5) and (6), the conversion loss and noise temperature of the mixer are obtained; the method is a method for testing the conversion loss and noise temperature of the terahertz mixer on the basis of noise. The test method has the advantages that the conversion loss and the noise temperature can be tested simultaneously. The method has the disadvantage that the test requires the test condition of a low temperature, and the test condition of an open space at the same time, and has high requirements for testing and environment.

SUMMARY

In order to overcome the defects in the prior art, the present disclosure provides a method and system for testing the conversion losses of terahertz mixers capable of eliminating the influence of radio frequency sources, completely eliminating the influence of the radio frequency source, and accurately testing the power of an intermediate frequency signal through the conversion performance of the mixer itself, i.e., the requirements for accurately testing the terahertz band mixer can be met, and the requirements on the test environment and test condition are low.

To achieve the foregoing objective, the present disclosure uses the following technical solutions:

In the first aspect, the present disclosure provides a method for testing the conversion losses of terahertz mixers capable of eliminating the influence of radio frequency sources.

The method for testing the conversion losses of terahertz mixers capable of eliminating the influence of radio frequency sources includes:

grouping a mixer to be tested and at least two reference mixers in pairs;

in each group, inputting a signal of a preset frequency and a preset power at an intermediate frequency port of a first mixer, and after up-conversion, outputting same to a second mixer to be down-converted, so as to obtain an output power with the frequency same as the preset frequency, and obtain the relationship between a first output power and a first preset power and the losses of two mixers;

according to the relationship between the loss of the mixer in each group and the power, obtaining the loss of the mixer to be tested.

In the second aspect, the present disclosure provides a system for testing the conversion losses of terahertz mixers capable of eliminating the influence of radio frequency sources.

The system for testing the conversion losses of terahertz mixers capable of eliminating the influence of radio frequency sources includes a mixer to be tested and at least two reference mixers;

all the mixers being grouped in pairs, and in each group,
a signal of a preset frequency and a preset power being input at an intermediate frequency port of a first mixer;
a signal up-converted through the first mixer being output to a radio frequency port of a second mixer through a directional coupler, after the second mixer performs down-conversion, an output power with the frequency same as the preset frequency being obtained so as to obtain the relationship between a first output power and a first preset power and the losses of two mixers;
according to the relationship between the loss of the mixer in each group and the power, the loss of the mixer to be tested being obtained.

Compared with the prior art, the present disclosure has the following beneficial effects:

1. The method and system described in the present disclosure completely eliminate the influence of the radio frequency source, and accurately test the power of the intermediate frequency signal through the conversion performance of the mixer itself, i.e., the requirements for accurately testing the terahertz band mixer can be met, and the requirements on the test environment and test condition are low.

2. In the method and system described in the present disclosure, the terahertz mixer to be tested is represented as A and the other two reference mixers (the reference mixers can also be two mixers to be tested, and it should be noted that the sum of the conversion losses of the mixer to be tested and the reference mixer cannot exceed the measurement range of a test instrument) are respectively represented as B and C; the three terahertz mixers A, B and C are combined in pairs; a signal of a frequency of 100 MHz is input through the intermediate frequency port of one mixer and the signal of 100 MHz is received by down-conversion of the other mixer; three tests are performed according to three groups of the mixers, and then three groups of equations containing the conversion losses of the three mixers can be obtained. By solving the three groups of equations, the accurate values of the conversion losses of the three mixers can be obtained, which cannot only obtain the losses of multiple mixers at one time, but also greatly improve the accuracy of the conversion losses.

BRIEF DESCRIPTION OF THE DRAWINGS

The accompanying drawings constituting a part of the present disclosure are used to provide further understanding of the present disclosure. Exemplary embodiments of the present disclosure and descriptions thereof are used to explain the present disclosure, and do not constitute an improper limitation to the present disclosure.

DETAILED DESCRIPTION

The present disclosure is further described below with reference to the accompanying drawings and examples.

It should be noted that the following detailed descriptions are all exemplary and are intended to provide a further description of the present disclosure. Unless otherwise specified, all technical and scientific terms used herein have the same meaning as commonly understood by a person of ordinary skill in the technical field to which the present disclosure belongs.

It should be noted that terms used herein are only for describing specific implementations and are not intended to limit exemplary implementations according to the present disclosure. As used herein, the singular form is intended to include the plural form, unless the context clearly indicates otherwise. In addition, it should further be understood that terms "include" and/or "comprise" used in this specification indicate that there are features, steps, operations, devices, components, and/or combinations thereof.

The embodiments in the present disclosure and features in the examples may be mutually combined in case that no conflict occurs.

Embodiment 1

Embodiment 1 of the present disclosure provides a method for testing the conversion losses of terahertz mixers capable of eliminating the influence of radio frequency sources, a terahertz mixer to be tested being represented as A and the other two reference mixers (the reference mixers can also be two mixers to be tested) being represented as B and C, respectively. The three terahertz mixers A, B and C are combined in pairs and divided into the first group of A and B, the second group of C and B, and the third group of A and C.

For the two terahertz mixers A and B in the first group, a signal of a frequency of 100 MHz and a power of $P_{IF\_IN\_A}$ is input at the intermediate frequency port of the mixer A (determined based on the intermediate frequency range of the mixer and a compression point of the mixer), the signal is up-converted through the mixer A, while the mixer B receives the signal of 100 MHz through down-conversion, the received power is $P_{IF\_OUT\_B}$, the conversion losses of the mixer A and the mixer B are noted as $CL_{\_A}$ and $CL_{\_B}$, $CL_{\_A}+CL_{\_B}=P_{IF\_IN\_A}-P_{IF\_OUT\_B}$; $CL_{\_C}+CL_{\_B}=P_{IF\_OUT\_B}$ and $CL_{\_A}+CL_{\_C}=P_{IF\_IN\_A}-P_{IF\_OUT\_C}$ can be obtained by using the same method, and the conversion losses $CL_{\_A}$, $CL_{\_B}$ and $CL_{\_C}$ of the mixers A, B and C can be accurately obtained by solving the above-mentioned three equations.

Figure 1:
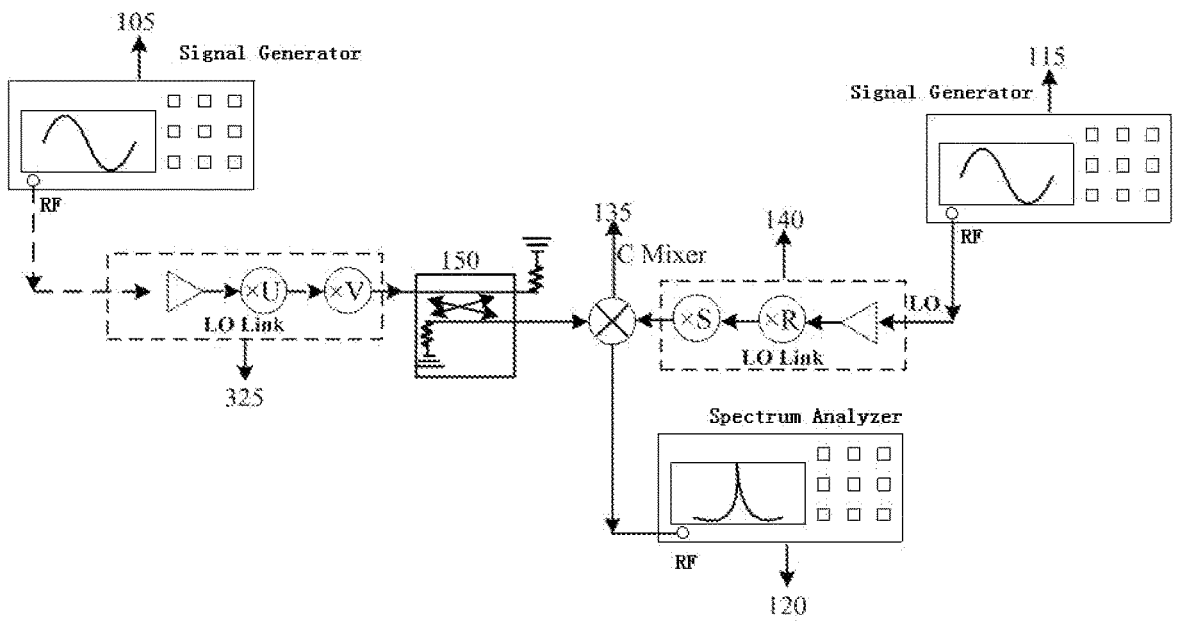
FIG. 1 is a schematic diagram of a test method provided in the background for exciting a terahertz mixer using a terahertz signal source.
Figure 2:
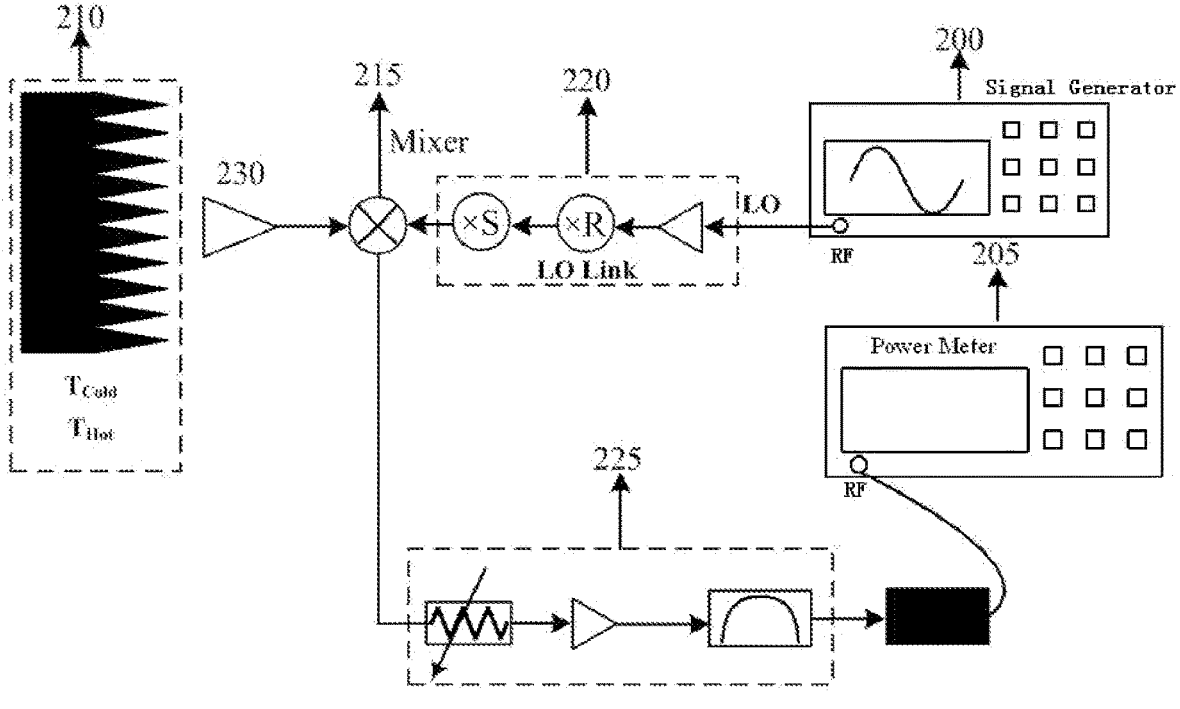
FIG. 2 is a schematic diagram of a Y-factor test method provided in the background.
Figure 3:
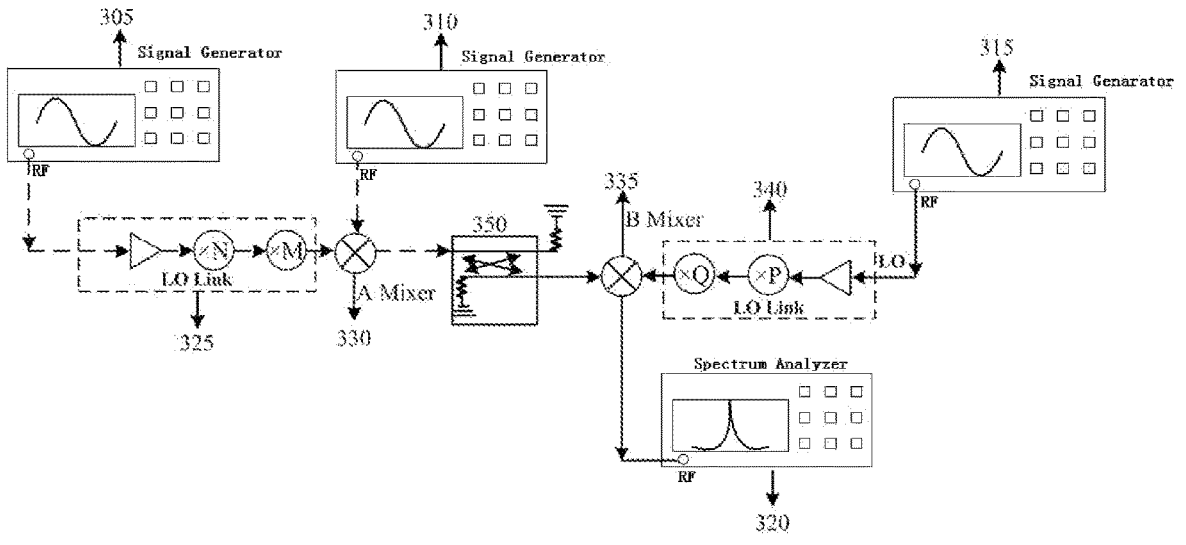
FIG. 3 is a schematic diagram for testing the conversion losses of terahertz mixers in the first group provided in Embodiment 1 of the present disclosure.

The specific steps for each group to perform testing are as follows:

as shown in FIG. 3, the two terahertz mixers A 330 and B 335 are in the first group, a microwave signal source 310 provides a signal of a frequency of 100 MHz and a power of $P_{IF\_IN\_AB}$ (determined based on the intermediate frequency range of the mixer A 330 and the compression point of the mixer), the signal is input through an intermediate frequency port of the mixer A 330, and up-mixed with a local oscillation signal $LO_{\_A}$ generated by the microwave signal source 305 and a local oscillation link 325 to generate an n*$LO_{\_A}$+100 MHz signal (n is the order of harmonics of the mixer A 330 and the fundamental wave mixing n is 1).

The signal is fed in through an input port of a directional coupler 350, fed to a radio frequency port of the mixer B 335 through a coupling port and down-mixed with a local oscillation signal $LO_{\_B}$ generated by a microwave signal source 315 and a local oscillation link 340, n*$LO_{\_A}$+100 MHz−m*$LO_{\_B}$=100 MHz (m is the order of harmonics of the mixer B 335 and the fundamental wave mixing m is 1). The output power of the signal of 100 MHz after being down-mixed by the mixer B 335 is $P_{IF\_OUT\_AB}$.

The orders of harmonics of the mixer A 330 and the mixer B 335 can be the same or different, and the number of frequency doubling times N×M in the local oscillation link of the mixer A 330 can be the same as or different from Q×P in the mixer B 335. The conversion losses of the mixer A and the mixer B are noted as $CL_{\_A}$ and $CL_{\_B}$:

$$CL_{\_A}+CL_{\_B}=P_{IF\_IN\_AB}-P_{IF\_OUT\_AB} \qquad (7)$$

Figure 4:
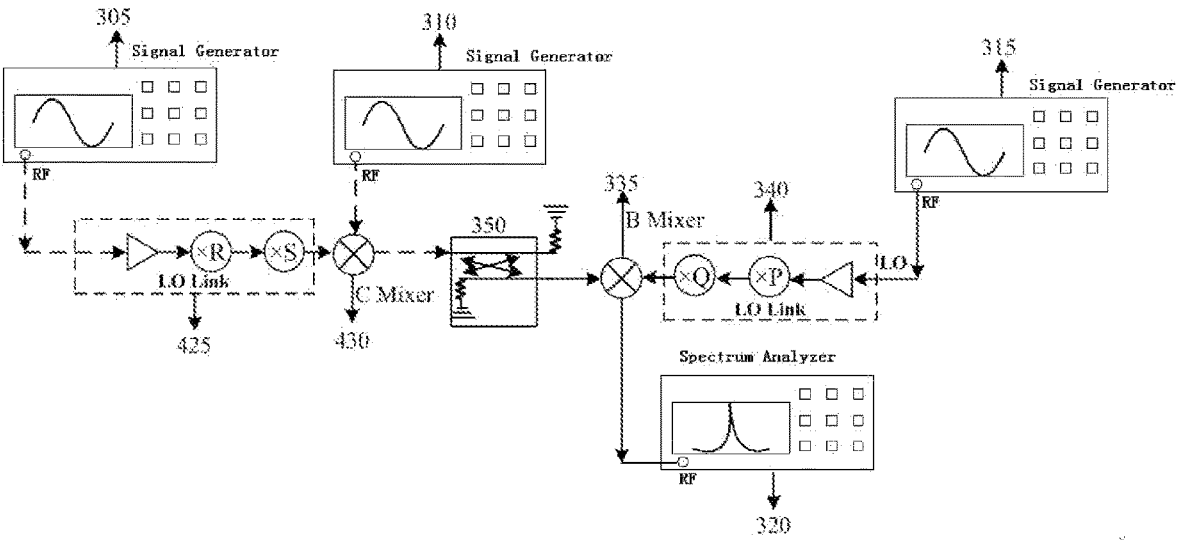
FIG. 4 is a schematic diagram for testing the conversion losses of terahertz mixers in the second group provided in Embodiment 1 of the present disclosure.

As shown in FIG. 4, the two terahertz mixers C 430 and B 335 are in the second group, a microwave signal source 310 provides a signal of a frequency of 100 MHz and a power of $P_{IF\_IN\_CB}$ (determined based on the intermediate frequency range of the mixer C 430 and the compression point of the mixer), the signal is input through an intermediate frequency port of the mixer C 430, and up-mixed with a local oscillation signal $LO_{\_C}$ generated by a microwave signal source 305 and a local oscillation link 425 to generate an s*$LO_{\_A}$+100 MHz signal (s is the order of harmonics of the mixer C 430 and the fundamental wave mixing s is 1).

The signal is fed in through an input port of a directional coupler 350, fed to a radio frequency port of the mixer B 335 through a coupling port and down-mixed with a local oscillation signal $LO_{\_B}$ generated by a microwave signal source 315 and a local oscillation link 340, s*$LO_{\_A}$+100 MHz−m*$LO_{\_B}$=100 MHz (m is the order of harmonics of the mixer B 335 and the fundamental wave mixing m is 1), and the output power of the signal of 100 MHz after being down-mixed by the mixer B 335 is $P_{IF\_OUT\_B}$.

The orders of harmonics of the mixer C 430 and the mixer B 335 can be the same or different, the number of frequency doubling times R×S in the local oscillation link of the mixer C 430 can be the same as or different from Q×P in the mixer B 335, and the conversion losses of the mixer C and the mixer B are noted as $CL_{\_C}$ and $CL_{\_B}$:

$$CL_{\_C}+CL_{\_B}=P_{IF\_IN\_CB}-P_{IF\_OUT\_CB} \qquad (8)$$

The two terahertz mixers A 330 and C 430 are in the third group, a microwave signal source 310 provides a signal of a frequency of 100 MHz and a power of $P_{IF\_IN\_AC}$ (determined based on the intermediate frequency range of the mixer A 330 and the compression point of the mixer), the signal is input through an intermediate frequency port of the mixer A 330, and up-mixed with a local oscillation signal $LO_{\_A}$ generated by a microwave signal source 305 and a local oscillation link 325 to generate an n*$LO_{\_A}$+100 MHz signal (n is the order of harmonics of the mixer A 330 and the fundamental wave mixing n is 1).

The signal is fed in through an input port of a directional coupler 350, fed to a radio frequency port of the mixer C 430 through a coupling port and down-mixed with a local oscillation signal $LO_C$ generated by a microwave signal source 315 and a local oscillation link 425, $n*LO_A+100$ MHz$-s*LO_C=100$ MHz (s is the order of harmonics of the mixer C 430 and the fundamental wave mixing s is 1), and the output power of the signal of 100 MHz after being down-mixed by the mixer C 430 is $P_{IF\_OUT\_AC}$.

Figure 5:
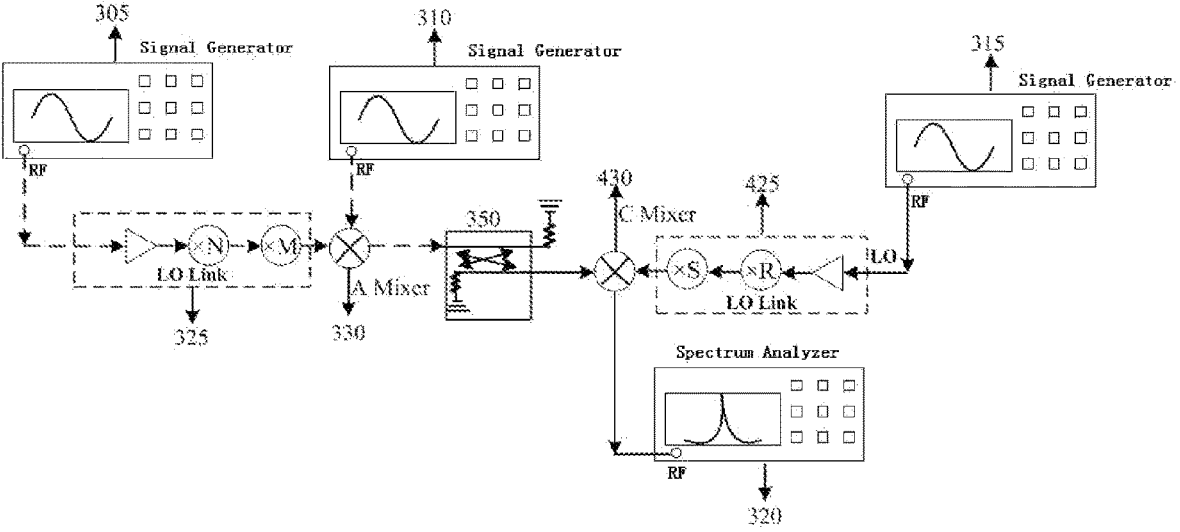
FIG. 5 is a schematic diagram for testing the conversion losses of terahertz mixers in the third group provided in Embodiment 1 of the present disclosure.

As shown in FIG. 5, the orders of harmonics of the mixer A 330 and the mixer C 430 can be the same or different, and the number of frequency doubling times R×S in the local oscillation link of the mixer C 430 can be the same as or different from a mixing and frequency doubling factor N×M in the mixer A 330.

The conversion losses of the mixer A and the mixer C are noted as $CL_A$ and $CL_C$.

$$CL_A+CL_C=P_{IF\_IN\_AC}-P_{IF\_OUT\_AC} \tag{9}$$

The respective losses of the mixer A, the mixer B and the mixer C can be obtained by combining the equations (7), (8) and (9).

In this embodiment, the frequency of the signal received by each mixer is not limited to 100 MHz, but can also be other values such as 10 MHz or 200 MHz, which can be designed by a person skilled in the art according to the specific operating conditions and will not be repeated here.

It will be appreciated that in some other implementations, the directional coupler can also be replaced by an attenuator or isolator, which can be selected by a person skilled in the art according to the specific operating conditions and will not be repeated here.

Embodiment 2

Embodiment 2 of the present disclosure provides a system for testing the conversion losses of terahertz mixers capable of eliminating the influence of radio frequency sources; 3, 4, 5 or more reference mixers are disposed, and the losses of the multiple mixers can be obtained by combining more equations to achieve batch testing of the multiple mixers, and the specific test method is the same as that in Embodiment 1 and will not be repeated here.

Embodiment 3

Embodiment 3 of the present disclosure provides a system for testing the conversion losses of terahertz mixers capable of eliminating the influence of radio frequency sources, including a mixer to be tested, two reference mixers and a spectrum analyzer;

all the mixers being grouped in pairs, and in each group, a signal of a preset frequency and a preset power being input at an intermediate frequency port of a first mixer;

a signal up-converted through the first mixer being output to a radio frequency port of a second mixer through a directional coupler and input into the spectrum analyzer after being down-converted by the second mixer, and an output power with the frequency same as the preset frequency being obtained so as to obtain the relationship between a first output power and a first preset power and the losses of two mixers;

according to the relationship between the loss of the mixer in each group and the power, the loss of the mixer to be tested being obtained.

The operation method of the system is the same as the method for testing the conversion losses of terahertz mixers capable of eliminating the influence of radio frequency sources provided in Embodiment 1 and will not be repeated here.

Embodiment 4

Embodiment 4 of the present disclosure provides a system for testing the conversion losses of terahertz mixers capable of eliminating the influence of radio frequency sources, including a mixer to be tested, three (may also be four, five or more) reference mixers and a spectrum analyzer, and other parts are same as those in Embodiment 3 and will not be repeated here.

A person skilled in the art should understand that the embodiments of the present disclosure may be provided as a method, a system, or a computer program product. Therefore, the present disclosure may use a form of hardware embodiments, software embodiments, or embodiments combining software and hardware. In addition, the present disclosure may use a form of a computer program product implemented on one or more computer-usable storage media (including but not limited to a disk memory and an optical memory) including computer-usable program code.

The present disclosure is described with reference to flowcharts and/or block diagrams of the method, apparatus (system), and computer program product in the embodiments of the present disclosure. It should be understood that computer program instructions can implement each procedure and/or block in the flowcharts and/or block diagrams and a combination of procedures and/or blocks in the flowcharts and/or block diagrams. These computer program instructions may be provided to a general-purpose computer, a dedicated computer, an embedded processor, or a processor of other programmable data processing apparatuses to generate a machine, so that the instructions executed by the computer or the processor of other programmable data processing apparatuses generate a device for implementing a specific function in one or more processes in the flowcharts and/or in one or more blocks in the block diagrams.

These computer program instructions may alternatively be stored in a computer-readable memory that can instruct a computer or other programmable data processing apparatuses to work in a specific manner, so that the instructions stored in the computer-readable memory generate an artifact that includes an instruction device. The instruction device implements a specific function in one or more procedures in the flowcharts and/or in one or more blocks in the block diagrams.

These computer program instructions may further be loaded onto a computer or other programmable data processing apparatuses, so that a series of operations and steps are performed on the computer or the other programmable apparatuses, thereby generating computer-implemented processing. Therefore, the instructions executed on the computer or the other programmable apparatuses provide steps for implementing a specific function in one or more procedures in the flowcharts and/or in one or more blocks in the block diagrams.

A person of ordinary skill in the art may understand that all or some of the procedures of the methods of the foregoing embodiments may be implemented by a computer program instructing relevant hardware. The program may be stored in a computer-readable storage medium. When the program is executed, the procedures of the foregoing method embodiments may be implemented. The foregoing storage medium may include a magnetic disc, an optical disc, a read-only memory (ROM) and a random access memory (RAM).

The foregoing descriptions are merely preferred embodiments of the present disclosure, but are not intended to limit the present disclosure. The present disclosure may include various modifications and changes for a person skilled in the art. Any modification, equivalent replacement, or improvement and the like made within the spirit and principle of the present disclosure shall fall within the protection scope of the present disclosure.

What is claimed is:

1. A method for testing the conversion losses of terahertz mixers capable of eliminating the influence of radio frequency sources, comprising:

grouping a mixer to be tested and at least two reference mixers in pairs;

in each group, inputting a signal with a first preset frequency and a first preset power at an intermediate frequency port of a first mixer, and after up-conversion, outputting same to a second mixer to be down-converted; wherein, the up-conversion and the down-conversion comprise the following steps:

in the each group, a first microwave signal source provides the signal with the first preset frequency and the first preset power, and the signal is input through the intermediate frequency port of the first mixer and up-mixed with a first local oscillation signal generated by a second microwave signal source and a first local oscillation link to generate a mixed signal with the first preset frequency;

the mixed signal is fed in through an input port of a directional coupler, then is fed to a radio frequency port of the second mixer through a coupling port, and then is down-mixed with a second local oscillation signal generated by a third microwave signal source and a second local oscillation link;

obtaining a first output power with a frequency same as the first preset frequency;

obtaining a relationship between the first output power and the first preset power and losses of two mixers in the each group; wherein, the relationship is defined as a sum of the losses of the two mixers in the each group is equal to a different value between the first output power and the first preset power of a corresponding group, the following formulas:

$$CL_{\_A}+CL_{\_B}=P_{IF\_IN\_AB}-P_{IF\_OUT\_AB},$$

$$CL_{\_C}+CL_{\_B}=P_{IF\_IN\_CB}-P_{IF\_OUT\_CB},$$

$$CL_{\_A}+CL_{\_C}=P_{IF\_IN\_AC}-P_{IF\_OUT\_AC},$$

wherein, $CL_{\_A}$, $CL_{\_B}$ and $CL_{\_C}$ respectively are the loss of the mixer to be tested and the at least two reference mixers; $P_{IF\_IN\_AB}$, $P_{IF\_IN\_CB}$ and $P_{IF\_IN\_AC}$ respectively are the first preset power of the corresponding group; and, $P_{IF\_OUT\_AB}$, $P_{IF\_OUT\_CB}$ and $P_{IF\_OUT\_AC}$ respectively are the first output power of the corresponding group; and obtaining the loss of the mixer to be tested according to the relationship obtained from the each group.

2. The method for testing the conversion losses of terahertz mixers capable of eliminating the influence of radio frequency sources according to claim 1, wherein according to the relationship between the loss of the mixer in each group and the power, the losses of the mixer to be tested and the reference mixer are obtained.

3. The method for testing the conversion losses of terahertz mixers capable of eliminating the influence of radio frequency sources according to claim 2, wherein the reference mixer is a mixer to be tested with an unknown loss.

4. The method for testing the conversion losses of terahertz mixers capable of eliminating the influence of radio frequency sources according to claim 1, wherein the at least two reference mixers comprise a first reference mixer and a second reference mixer are provided, and the mixer to be tested, the first reference mixer and the second reference mixer are grouped in pairs to obtain three groups.

5. The method for testing the conversion losses of terahertz mixers capable of eliminating the influence of radio frequency sources according to claim 1, wherein the preset frequency is 100 MHz.

6. The method for testing the conversion losses of terahertz mixers capable of eliminating the influence of radio frequency sources according to claim 1, wherein a signal up-converted is fed in through an input port of a directional coupler and fed to a radio frequency port of the second mixer through a coupling port.

7. The method for testing the conversion losses of terahertz mixers capable of eliminating the influence of radio frequency sources according to claim 1, wherein in the same group, the numbers of frequency doubling times in local oscillation links of two mixers are the same;

or, in the same group, the numbers of frequency doubling times in local oscillation links of two mixers are different;

or, in the same group, the orders of harmonics of two mixers are the same;

or, in the same group, the orders of harmonics of two mixers are different;

or, the signal of the preset frequency and the preset power is determined according to the intermediate frequency range of the mixer and the compression point of the mixer.

8. A system for testing conversion losses of terahertz mixers capable of eliminating the influence of radio frequency sources, comprising a mixer to be tested and at least two reference mixers;

all the mixers being grouped in pairs, and in each group, a signal with a first preset frequency and a first preset power is input at an intermediate frequency port of a first mixer;

the signal is up-converted through the first mixer and then is output to a radio frequency port of a second mixer through a directional coupler, after the second mixer performs down-conversion, a first output power with a frequency same as the first preset frequency being obtained; wherein, the up-conversion and the down-conversion comprise the following steps:

in the each group, a first microwave signal source provides the signal with the first preset frequency and the first preset power, and the signal is input through the intermediate frequency port of the first mixer and up-mixed with a first local oscillation signal generated by a second microwave signal source and a first local oscillation link to generate a mixed signal with the first preset frequency;

the mixed signal is fed in through an input port of a directional coupler, then is fed to a radio frequency port of the second mixer through a coupling port, and then is down-mixed with a second local oscillation signal generated by a third microwave signal source and a second local oscillation link;

obtaining a relationship between the first output power and the first preset power and losses of two mixers in the each group; wherein, the relationship is defined as a sum of the losses of the two mixers in the each group is equal to a different value between the first output power and the first preset power of a corresponding group, the following formulas:

$$CL_{\_A} + CL_{\_B} = P_{IF\_IN\_AB} - P_{IF\_OUT\_AB},$$

$$CL_{\_C} + CL_{\_B} = P_{IF\_IN\_CB} - P_{IF\_OUT\_CB},$$

$$CL_{\_A} + CL_{\_C} = P_{IF\_IN\_AC} - P_{IF\_OUT\_AC},$$

wherein, $CL_{\_A}$, $CL_{\_B}$ and $CL_{\_C}$ respectively are the loss of the mixer to be tested and the at least two reference mixers; $P_{IF\_IN\_AB}$, $P_{IF\_IN\_CB}$ and $P_{IF\_IN\_AC}$ respectively are the first preset power of the corresponding group; and, $P_{IF\_OUT\_AB}$, $P_{IF\_OUT\_CB}$ and $P_{IF\_OUT\_AC}$ respectively are the first output power of the corresponding group; and the loss of the mixer to be tested is obtained according to the relationship obtained from the each group.

\* \* \* \* \*